United States Patent
Wang et al.

(10) Patent No.: US 7,153,577 B2
(45) Date of Patent: Dec. 26, 2006

(54) HEAT TREATABLE COATED ARTICLE WITH DUAL LAYER OVERCOAT

(75) Inventors: Hong Wang, Belleville, MI (US); Anton Dietrich, Azmoos (CH)

(73) Assignees: Guardian Industries Corp., Auburn Hills, MI (US); Centre Luxembourg de Recherches pour le Verre et la Ceramique S.A. (C.R.V.C.), Luxembourg (LU)

( * ) Notice: Subject to any disclaimer, the term of this patent is extended or adjusted under 35 U.S.C. 154(b) by 35 days.

(21) Appl. No.: 10/608,560

(22) Filed: Jun. 30, 2003

(65) Prior Publication Data

US 2004/0058169 A1 Mar. 25, 2004

Related U.S. Application Data

(60) Continuation-in-part of application No. 10/337,384, filed on Jan. 7, 2003, now Pat. No. 6,686,050, and a continuation-in-part of application No. 10/337,383, filed on Jan. 7, 2003, now Pat. No. 6,723,211, which is a division of application No. 09/794,224, filed on Feb. 28, 2001, now Pat. No. 6,576,349.

(60) Provisional application No. 60/217,101, filed on Jul. 10, 2000.

(51) Int. Cl.
  *B32B 15/00* (2006.01)
(52) U.S. Cl. ............ 428/428; 428/432; 428/448; 428/450; 428/469; 428/698; 428/701; 428/702
(58) Field of Classification Search ............ 428/428, 428/432, 448, 450, 469, 697, 698, 701, 702
See application file for complete search history.

(56) References Cited

U.S. PATENT DOCUMENTS

| | | | |
|---|---|---|---|
| 4,450,201 A | 5/1984 | Brill et al. | |
| 4,532,181 A | 7/1985 | Brill et al. | |
| 5,302,449 A * | 4/1994 | Eby et al. | 428/336 |
| 5,557,462 A | 9/1996 | Hartig et al. | |
| 5,563,734 A | 10/1996 | Wolfe et al. | |
| 5,709,930 A | 1/1998 | DePauw | |
| 5,837,108 A * | 11/1998 | Lingle et al. | 204/192.15 |
| 5,935,702 A | 8/1999 | Macquart et al. | |
| 6,132,881 A * | 10/2000 | Hartig et al. | 428/432 |
| 6,159,607 A * | 12/2000 | Hartig et al. | 428/426 |
| 6,159,621 A | 12/2000 | Schicht et al. | |
| 6,445,503 B1 | 9/2002 | Lingle | |
| 6,492,619 B1 * | 12/2002 | Sol | 219/203 |

(Continued)

FOREIGN PATENT DOCUMENTS

DE  30 27 256  2/1982

OTHER PUBLICATIONS

International Search Report mailed May 17, 2005.

*Primary Examiner*—John J. Zimmerman
*Assistant Examiner*—Timothy M. Speer
(74) *Attorney, Agent, or Firm*—Nixon & Vanderhye P.C.

(57) ABSTRACT

A coated article is provided so as to include an overcoat having an outermost layer including silicon nitride which overlies an underlayer including a metal oxide ($MO_x$) or a metal oxynitride ($MO_xN_y$), where the metal (M) is selected from the group of Cr, Nb, Hf, Ta, and/or combinations thereof. Such an overcoat provides for good mechanical and chemical protection in the context of heat treatable coated articles. Coated articles herein may be used in the context of insulating glass (IG) window units, architectural or residential monolithic window units, vehicle windows, and/or the like.

30 Claims, 3 Drawing Sheets

U.S. PATENT DOCUMENTS

| | | |
|---|---|---|
| 6,495,251 B1 | 12/2002 | Arbab et al. |
| 6,495,263 B1 | 12/2002 | Stachowiak |
| 6,576,349 B1 | 6/2003 | Lingle et al. |
| 6,627,317 B1 * | 9/2003 | Wang ......................... 428/428 |
| 6,830,817 B1 * | 12/2004 | Stachowiak ................. 428/432 |
| 2002/0031674 A1 | 3/2002 | Laird |
| 2002/0034641 A1 | 3/2002 | Ebisawa et al. |
| 2002/0064662 A1 | 5/2002 | Lingle et al. |
| 2003/0049463 A1 | 3/2003 | Wang |

* cited by examiner

HEAT TREATABLE COATED ARTICLE WITH DUAL LAYER OVERCOAT

PRIORITY CLAIM

This application is a continuation-in-part (CIP) of each of U.S. patent application Ser. No. 10/337,384 (now U.S. Pat. No. 6,686,050) and Ser. No. 10/337,383 (now U.S. Pat. No. 6,723,211) each filed Jan. 7, 2003, which are both divisions of U.S. patent application Ser. No. 09/794,224, filed Feb. 28, 2001 (now U.S. Pat. No. 6,576,349), which claims priority on Provisional Application Ser. No. 60/217,101 filed on Jul. 10, 2000. The disclosures of Ser. Nos. 10/337,384, 10/337,383 and 09/794,224 (U.S. Pat. No. 6,576,349) are hereby incorporated herein by reference. Priority is hereby claimed on each of the aforesaid applications.

BACKGROUND OF THE INVENTION

Windows including glass substrates with solar control coatings provided thereon are known in the art. Such windows may be used in the context of architectural windows, insulating glass (IG) window units, automotive windows, and/or the like.

Commonly owned U.S. Pat. No. 5,837,108 discloses a heat treatable coated article having a layer stack of glass/$Si_3N_4$/NiCr/$Si_3N_4$. In this coated article, the silicon nitride overcoat is the sole protector of the NiCr infrared (IR) reflecting layer. The silicon nitride overcoat is for protecting the NiCr layer from both mechanical damage (e.g., scratching) and chemical attacks.

Unfortunately, it has recently been discovered that when coated articles such as this (i.e., glass/$Si_3N_4$/NiCr/$Si_3N_4$) are heat treated (e.g., thermally tempered, heat strengthened, or the like), tiny pinholes tend to form in the silicon nitride overcoat layer due to such heat treatment. After the pinholes form in the silicon nitride overcoat due to heat treatment, the silicon nitride overcoat while still being a good mechanical protector is less than desirable with respect to chemical protection. In other words, the coated article (especially the NiCr layer) is subject to corrosion. Thus, heat treated coated articles with an overcoat of merely silicon nitride are sometimes lacking with respect to chemical durability, both in the field and/or during transport/storage when exposure to certain chemicals can occur.

Other known coated articles use a protective overcoat of tin oxide. Unfortunately, tin oxide overcoats are undesirable with respect to mechanical durability (e.g., scratch resistance).

DE 3027256 discloses a coated article having dual-layer structure which deals with $TiO_2$ and $TiN/TiO_xN_y$. Unfortunately, these materials are too porous and lead to a lack of durability in commercial applications.

Still further coated articles use a dual layer protective overcoat of silicon nitride and tin oxide. For example, see parent published application Ser. No. 2002/0064662 (see also corresponding U.S. Pat. No. 6,576,349) which is incorporated herein by reference, which discusses a protective overcoat having an outer layer of silicon nitride and an underlayer of tin oxide. Unfortunately, while the silicon nitride provides good protection against mechanical damage (e.g., scratching), after the tiny pinholes are formed in the silicon nitride due to heat treatment as discussed above, the underlying tin oxide often does not provide sufficient protection with respect to chemical attacks on the coating. In other words, the tin oxide portion of the tin oxide/silicon nitride/air dual layer overcoat of Ser. No. 2002/0064662 merely acts as an optical matching layer as opposed to a protector against chemical attack. As a result, it has unfortunately been found that despite the presence of a dual layer overcoat of tin oxide/silicon nitride/air, such heat treated products may sometimes suffer from high temperature/high humidity failures when subjected to certain chemicals.

In view of the above, it can be seen that there exists a need in the art for an improved overcoat for heat treatable coated articles. In particular, there exists a need in the art for an overcoat that is more chemically durable.

BRIEF SUMMARY OF EXAMPLE EMBODIMENTS

In certain example embodiments of this invention, there is provided a heat treatable coated article having an overcoat including a layer comprising silicon nitride which overlies a layer comprising a metal oxide ($MO_x$) or a metal oxynitride ($MO_xN_y$), where M is selected from the group of Cr, Nb, Hf and/or Ta. It has surprisingly been found that such an overcoat provides significantly improved chemical protection in heat treatable products compared to merely a silicon nitride overcoat or a tin oxide/silicon nitride/air overcoat. The silicon nitride inclusive layer is the outermost layer (i.e., the environmental layer) and provides for mechanical and primary chemical durability. The underlying substantially transparent layer of $MO_x$ or $MO_xN_y$, provided under the layer comprising silicon nitride, compensates for the aforesaid pinhole-related chemical durability weaknesses associated with the silicon nitride.

It has surprisingly been found that the $MO_x$ or $MO_xN_y$ underlayer (where M is selected from the group of Cr, Nb, Hf and/or Ta) causes the formation of pinholes in the overlying silicon nitride inclusive layer to be reduced and/or eliminated during heat treatment, and/or any such pinholes formed in the silicon nitride do not continue through the underlayer. Accordingly, it can be seen that both mechanical and chemical durability can be realized, even in the context of a heat treatable coated article.

Such multi-layer overcoats may be used in the context of heat treatable products which utilize infrared (IR) reflecting layer(s) including or of Ni, NiCr, Nb, NbCr, Ag, Au, and/or the like.

Certain example embodiments of this invention provide a heat treatable coated article including a multi-layer coating supported by a glass substrate, wherein the coating comprises: at least one infrared (IR) reflecting layer; and an overcoat located over at least the IR reflecting layer for protecting at least the IR reflecting layer, wherein the overcoat comprises an outer layer comprising silicon nitride and an underlayer comprising chromium oxide, wherein the outer layer and the underlayer are in direct contact with one another, with the outer layer being provided over the underlayer.

Other example embodiments of this invention provide a heat treatable coated article including a multi-layer coating supported by a glass substrate, wherein the coating comprises: at least one infrared (IR) reflecting layer; and an overcoat located over at least the IR reflecting layer for protecting at least the IR reflecting layer, wherein the overcoat comprises an outer layer comprising silicon nitride and an underlayer comprising a metal (M) oxide and/or a metal (M) oxynitride, where the metal (M) is selected from the group consisting of Nb, Hf, Ta, Cr, and combinations thereof.

In still further example embodiments of this invention, there is provided a heat treatable coated article including a multi-layer coating supported by a glass substrate, wherein the coating comprises: at least one infrared (IR) reflecting layer; and an overcoat located over at least the IR reflecting layer for protecting at least the IR reflecting layer, wherein the overcoat comprises an outer layer comprising silicon nitride and an underlayer comprising a metal (M) oxide and/or a metal (M) oxynitride, where the metal (M) is at least one of Nb, Hf, Ta, or a combination thereof.

DETAILED DESCRIPTION OF EXAMPLE EMBODIMENTS OF THE INVENTION

Figure 1:
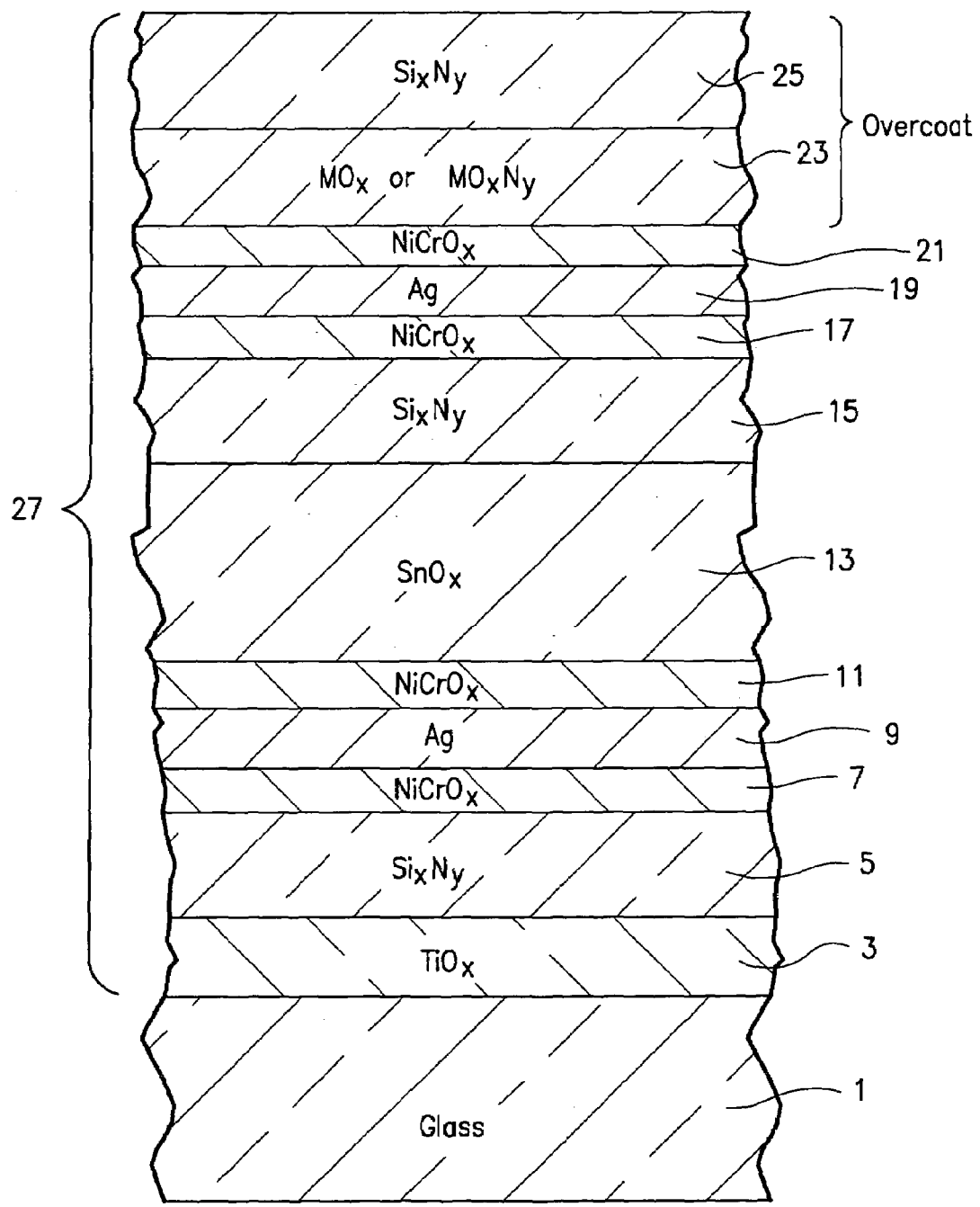
FIG. 1 is a cross sectional view of a coated article according to an example embodiment of this invention.

In certain example embodiments of this invention, there is provided a heat treatable coated article having a multi-layer overcoat (e.g., see layers 23 and 25 in FIGS. 1–3) including a layer comprising silicon nitride which overlies a layer comprising a metal oxide ($MO_x$) or a metal oxynitride ($MO_xN_y$), where M is selected from the group of Cr, Nb, Hf and/or Ta. This multi-layer overcoat may be provided over any suitable combination of layers/coatings in different embodiments of this invention, and the layers under the overcoat shown in the accompanying drawings are not intended to be limiting unless specifically claimed.

It has surprisingly been found that such a multi-layer overcoat (e.g., see layers 23 and 25 in FIGS. 1–3), which includes a layer comprising silicon nitride which overlies a layer comprising a metal oxide ($MO_x$) or a metal oxynitride ($MO_xN_y$) (where M is selected from the group of Cr, Nb, Hf and/or Ta), provides significantly improved chemical protection in heat treatable products compared to merely a silicon nitride overcoat or a tin oxide/silicon nitride/air overcoat. The silicon nitride inclusive layer is the outermost layer (i.e., the environmental layer) and provides for mechanical and primary chemical durability. The underlying substantially transparent layer of $MO_x$ or $MO_xN_y$, provided directly under the layer comprising silicon nitride, compensates for the aforesaid pinhole-related chemical durability weaknesses associated with the silicon nitride.

In the metal oxide context, for example, example $MO_x$ layers for the underlayer of the overcoat include $Cr_2O_3$, $Nb_2O_5$, $Hf_2O_3$, and/or $Ta_2O_5$, or a combination of one or more of these materials. Of course, oxynitrides of these may also be used as mentioned above.

In particular, the $MO_x$ or $MO_xN_y$ underlayer (where M is selected from the group of Cr, Nb, Hf and/or Ta) may cause the formation of pinholes in the overlying silicon nitride to be reduced and/or eliminated during heat treatment. It is believed that the significant thermal and/or chemical stability of such an underlayer(s) may reduce and/or prevent pinhole formations in the overlying silicon nitride. Moreover, in the event that such pinholes do occur, any such pinholes formed in the silicon nitride do not continue through the underlayer due to the material thereof discussed herein. The material of the $MO_x$ or $MO_xN_y$ underlayer is also chosen to compensate for brittleness of the overlying silicon nitride which can sometimes be responsible for micro-crack formations as a result of heat treatment (HT). Accordingly, it can be seen that both mechanical and chemical durability can be realized.

Example advantages associated with certain example embodiments of this invention relate to improved chemical and/or mechanical durability in the context of heat treatable products. In particular, chemical resistance may be significantly improved compared to the aforesaid coated articles of U.S. Pat. No. 5,837,108 for example, thereby improving yields and reducing field failures. Additionally, shelf life may be increased, the need for special packaging and/or shipping precautions (e.g., edge tape) may be reduced and/or eliminated, and/or field failures due to poor handling and chemical exposure may be reduced.

Coated articles herein may be used in the context of insulating glass (IG) window units, architectural window units, residential window units (e.g., IG and/or monolithic), vehicle window units such as laminated windshields, backlites, or sidelites, and/or other suitable applications. Certain example embodiments of this invention are particularly applicable in the context of heat treated coated articles (e.g., thermally tempered, heat strengthened, heat bent, or the like).

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 6.5 mm thick), and coating (or layer system) 27 provided on the substrate 1 either directly or indirectly. The overcoat, including at least layers 23 and 25, is part of the overall coating 27. The coating (or layer system) 27 may include: optional titanium oxide layer 3 (e.g., a first dielectric layer), dielectric silicon nitride layer 5 which may be $Si_3N_4$, or a Si-rich type, first lower contact layer 7 which contacts and protects IR reflecting layer 9, first conductive and potentially metallic infrared (IR) reflecting layer 9, first upper contact layer 11 which contacts and protects IR reflecting layer 9, dielectric layer 13, another silicon nitride inclusive layer 15 (stoichiometric type or Si-rich type), second lower contact layer 17 which contacts and protects IR reflecting layer 19, second upper contact layer 21 which contacts and protects upper IR reflecting layer 19, finally the protective dual-layer overcoat which includes layers 23 and 25. The "contact" layers 7, 11, 17 and 21 each contact at least one IR reflecting layer (e.g., Ag layer). The aforesaid layers 3–25 make up low-E (i.e., low emissivity) coating 27 which is provided on glass or plastic substrate 1.

Infrared (IR) reflecting layers 9 and 19 are preferably metallic and/or conductive, and may comprise or consist essentially of silver (Ag), gold, NiCr, Ni, Nb, Cr, nitrides thereof, and/or any other suitable IR reflecting material such as metals or metal nitrides. These IR reflecting layers help allow coating 27 to have low-E and/or good solar control characteristics. The IR reflecting layer(s) may be slightly oxidized in certain embodiments of this invention.

The contact layers 7, 11, 17 and/or 21 may be of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, $NiCrO_x$ for/in these layers allows durability to be improved. The $NiCrO_x$ layers may be fully oxidized in certain embodiments of this invention (i.e., fully stoichiometric), or may be at least about 50% oxidized in other embodiments of this invention. While $NiCrO_x$ is a preferred material for these contact layers, those skilled in the art will recognize that other materials may instead be used. Contact layers 11 and/or 21 (e.g., of or including NiCrO$_x$) may or may not be oxidation graded in different embodiments of this invention. Oxidation grading means that the degree of oxidation in the layer(s) changes throughout the thickness of the layer(s) so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers 7, 11, 17 and/or 21 are set forth in U.S. Published Patent Application No. 2002/0064662, the disclosure of which is hereby incorporated herein by reference.

Silicon nitride inclusive dielectric layer(s) 5 and/or 15 is/are provided so as to, among other things, improve heat-treatability of the coated articles, e.g., such as thermal tempering or the like. Further details regarding these silicon nitride inclusive layers may be found in one or more of the parent applications, which are incorporated herein by reference. For instance, the silicon nitride of layers 5 and/or 15 may be stoichiometric or non-stoichiometric in different embodiments of this invention. The use of Si-rich silicon nitride in layer(s) 5 and/or 15 may be beneficial in certain example embodiments with respect to reducing undesirable haze or the like.

Dielectric layer 13 acts as a coupling layer between the two halves of the coating 27, and is of or includes tin oxide in certain example embodiments of this invention. However, other dielectric materials may instead be used for layer 13.

The overcoat includes at least layers 23 and 25, and is provided for allowing environmental resistance of the coating 27, and may also be provided for color purposes. The overlying or outer layer 25 of the overcoat is of or includes silicon nitride in certain embodiments of this invention, and may be stoichiometric or non-stoichiometric in different embodiments of this invention. The outer layer 25 of silicon nitride is preferably doped with a material such as aluminum (Al) and/or stainless steel for purposes of sputtering as known in the art. In such instances, the outer layer 25 may include 15% or less of Al and/or stainless steel, more preferably about 10% or less. The underlayer 23 of the overcoat is of or includes a metal oxide (MO$_x$) or a metal oxynitride (MO$_x$N$_y$), where the metal (M) is selected from the group of Cr, Nb, Hf and/or Ta. In certain example embodiments, layers 23 and 25 directly contact one another. The substantially transparent silicon nitride inclusive layer 25 is the outermost layer (i.e., the environmental layer) and provides for mechanical and primary chemical durability. The underlying substantially transparent layer of MO$_x$ or MO$_x$N$_y$ 23 compensates for the aforesaid pinhole-related chemical durability weaknesses associated with the silicon nitride layer 25.

It has surprisingly been found that the MO$_x$ or MO$_x$N$_y$ underlayer 23 of the overcoat (where M is selected from the group of Cr, Nb, Hf and/or Ta, or combinations thereof) causes the formation of pinholes in the overlying silicon nitride inclusive layer 25 to be reduced and/or eliminated during heat treatment, and/or any such pinholes formed in the silicon nitride do not continue through the underlayer 23. It is believed that the significant thermal and/or chemical stability of such an underlayer(s) 23 including these material(s) reduces and/or prevents pinhole formations in the overlying silicon nitride inclusive layer 25. The material of the MO$_x$ or MO$_x$N$_y$ underlayer is also chosen to compensate for brittleness of the overlying silicon nitride which can sometimes be responsible for micro-crack formations as a result of heat treatment (HT). Accordingly, it can be seen that both mechanical and chemical durability can be realized.

Oxides and oxynitrides of the aforesaid metals M (Cr, Nb, Hf and Ta) are dense, chemically inert and thermally stable. However, they are typically not used in overcoats because they are soft and may be optically absorbing compared to silicon nitride. However, a dual-layer overcoat including an outer layer 25 comprising silicon nitride and an underlayer 23 comprising MO$_x$ and/or MO$_x$N$_y$ provides the best of both worlds; i.e., the chemical and mechanical durability of the silicon nitride, coupled with the thermally stable and chemically inert nature of the MO$_x$ or MO$_x$N$_y$. As explained above, it has surprisingly been found that pinhole formations in the silicon nitride can also be reduced using such an underlayer 23, and/or any such pinholes formed in the silicon nitride do not continue through the underlayer 23, which allows for excellent durability to be realized even after heat treatment. The protection of the underlying IR reflecting layer(s) (e.g., Ag) is significantly improved.

Other layer(s) below or above the illustrated coating 27 may also be provided. Thus, while the layer system or coating 27 is "on" or "supported by" substrate 1 (directly or indirectly), other layer(s) may be provided therebetween. Thus, for example, coating 27 of FIG. 1 may be considered "on" and "supported by" the substrate 1 even if other layer(s) are provided between layer 3 and substrate 1. Moreover, certain layers of coating 27 may be removed in certain embodiments, while others may be added between the various layers or the various layer(s) may be split with other layer(s) added between the split sections in other embodiments of this invention without departing from the overall spirit of certain embodiments of this invention. In certain example embodiments of this invention, additional layer(s) may be provided between layers 21 and 23.

The overcoat including layers 23 and 25 may be used to protect any suitable underlying coating; i.e., layers 3–21 in FIG. 1 are provided for purposes of example only. Other layer(s) may instead be used. For example, consider other embodiments discussed below.

As shown in FIG. 1, layers 23 and 25 are in direct contact with one another. However, in alternative embodiments of this invention, an additional layer(s) may be provided between layers 23 and 25.

Figure 3:
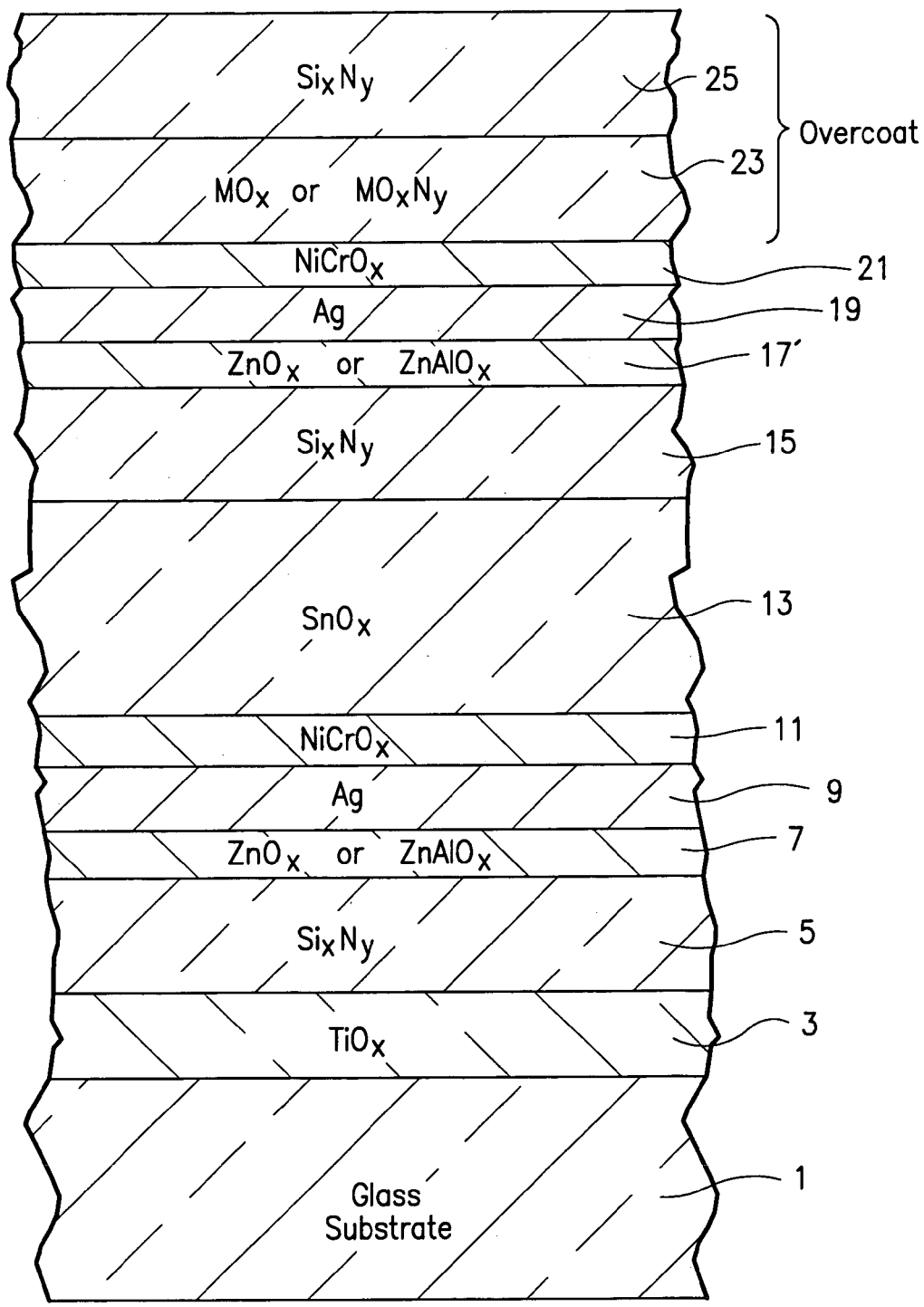
FIG. 3 is a cross sectional view of a coated article according to yet another example embodiment of this invention.

FIG. 3 illustrates another example embodiment of this invention. The coated article of FIG. 3 is similar to that of FIG. 1, except for the lower contact layers. In particular, in the FIG. 3 embodiment, lower contact layers 7' and 17' may comprise zinc oxide (e.g., ZnO) in certain example embodiments of this invention. The zinc oxide may contain Al (e.g., to form ZnAlO$_x$) or other element(s) in certain example embodiments. In certain alternative embodiments of this invention, another layer (e.g., an oxide of NiCr, an oxide of Ni, or the like) may be provided between the zinc oxide inclusive layer 7' (or 17') and the nearest IR reflecting layer 9 (or 19').

Using the FIG. 3 embodiment as an example, while various thicknesses may be used in different embodiments of this invention, example thicknesses and materials for the respective layers on the glass substrate 1 in the FIG. 3 embodiment are as follows, from the glass substrate outwardly:

TABLE 1

(Example Materials/Thicknesses; FIG. 3 Embodiment)

| Layer | Preferred Range (Å) | More Preferred (Å) | Example (Å) |
|---|---|---|---|
| TiO$_x$ (3) | 20–400 Å | 20–60 Å | 40 Å |
| Si$_x$N$_y$ (5) | 50–450 Å | 90–200 Å | 113 Å |
| ZnO$_x$ (7') | 10–300 Å | 40–150 Å | 100 Å |
| Ag (9) | 50–250 Å | 80–120 Å | 95 Å |
| NiCrO$_x$ (11) | 10–100 Å | 15–35 Å | 26 Å |
| SnO$_2$ (13) | 0–1,000 Å | 350–800 Å | 483 Å |
| Si$_x$N$_y$ (15) | 50–450 Å | 90–200 Å | 113 Å |
| ZnO$_x$ (17') | 10–300 Å | 40–150 Å | 100 Å |
| Ag (19) | 50–250 Å | 80–220 Å | 131 Å |
| NiCrO$_x$ (21) | 10–100 Å | 15–35 Å | 26 Å |
| MO$_x$ or MO$_x$N$_y$ (23) | 10–500 Å | 20–150 Å | 50 Å |
| Si$_3$N$_4$ (25) | 50–750 Å | 120–320 Å | 200 Å |

It can be seen that, in the overcoat, layer 23 is preferably thinner than silicon nitride inclusive layer 25. In certain example embodiments of this invention, the outer silicon nitride inclusive layer 25 is at least two times as thick as the MO$_x$ and/or MO$_x$N$_y$ underlying layer 23 (more preferably three times as thick, and sometimes at least four times as thick). This is because the silicon nitride is the provider of the primary chemical and mechanical durability, whereas the underlying layer 23 is provided for thermal and/or chemical stability purposes to reduce the number of defects in the silicon nitride 25 caused by heat treatment.

In certain example embodiments of this invention, coated articles according to the FIGS. 1 and/or 3 embodiment(s) (or other embodiments of this invention) may have the following low-E (low emissivity) characteristics set forth in Table 2 when measured monolithically (before any optional HT). The sheet resistances (R$_s$) herein take into account all IR reflecting layers (e.g., silver layers 9, 19) in the coating, unless expressly stated to the contrary.

TABLE 2

Low-E/Solar Characteristics (Monolithic; pre-HT; FIGS. 1 and 3)

| Characteristic | General | More Preferred | Most Preferred |
|---|---|---|---|
| R$_s$ (ohms/sq.): | <=5.0 | <=3.5 | <=3.0 |
| E$_n$: | <=0.07 | <=0.04 | <=0.03 |

In certain example embodiments, coated articles according to the FIGS. 1 and/or 3 embodiments (or other embodiments) may have the following characteristics, measured monolithically for example, after HT:

TABLE 3

Low-E/Solar Characteristics (Monolithic; post-HT; FIGS. 1 and 3)

| Characteristic | General | More Preferred | Most Preferred |
|---|---|---|---|
| R$_s$ (ohms/sq.): | <=4.5 | <=3.0 | <=2.5 |
| E$_n$: | <=0.07 | <=0.04 | <=0.03 |

Moreover, coated articles including coatings 27 according to the FIGS. 1 and/or 3 embodiments (or other embodiments) may have the following optical characteristics (e.g., when the coating(s) is provided on a clear soda lime silica glass substrate 1 from 1 to 10 mm thick) (HT or non-HT). In Table 4, all parameters are measured monolithically, unless stated to the contrary. In Table 4 below, R$_g$Y is visible reflection from the glass (g) side of the monolithic article, while R$_f$Y is visible reflection from the side of the monolithic article on which coating/film (f) (i.e., coating 27) is located. It is noted that the SHGC, SC, TS and ultraviolet transmission characteristics are in the context of an IG Unit (not monolithic like the rest of the data in Table 4), and the ΔE* values are of course due to HT and thus taken after HT (e.g., heat strengthening, tempering, and/or heat bending).

TABLE 4

Optical Characteristics (FIG. 1 and 3 embodiments)

| Characteristic | General | More Preferred |
|---|---|---|
| T$_{vis}$ (or TY)(Ill. C, 2 deg.): | >=70% | >=75% |
| a*$_t$ (Ill. C, 2°): | −4.0 to +1.0 | −3.0 to 0.0 |
| b*$_t$ (Ill. C, 2°): | −1.0 to +4.0 | 0.0 to 3.0 |
| R$_g$Y (Ill. C, 2 deg.): | 1 to 10% | 3 to 7% |
| a*$_g$ (Ill. C, 2°): | −4.5 to +2.0 | −3.0 to 0.0 |
| b*$_g$ (Ill. C, 2°): | −5.0 to +4.0 | −4.0 to +3.0 |
| R$_f$Y (Ill. C, 2 deg.): | 1 to 7% | 1 to 6% |
| a*$_f$ (Ill. C, 2°): | −8.0 to 5.0 | −6.0 to 3.0 |
| b*$_f$ (Ill. C, 2°): | −9.0 to 10.0 | −7.0 to 8.0 |
| ΔE*$_t$ (transmissive): | <=8.0 | <=5.0, 4.0, 3.0 or 2.5 |
| ΔE*$_g$ (glass side reflective): | <=8.0 | <=5.0, 4.0, 3.0 or 2.5 |
| T$_{ultraviolet}$ (IG): | <=40% | <=35% |
| SHGC (surface #2) (IG): | <=0.45 | <=0.40 |
| SC (#2) (IG): | <=0.49 | <=0.45 |
| TS% (IG): | <=40% | <=37% |
| Haze (post-HT): | <=0.4 | <=0.35 |

Figure 2:
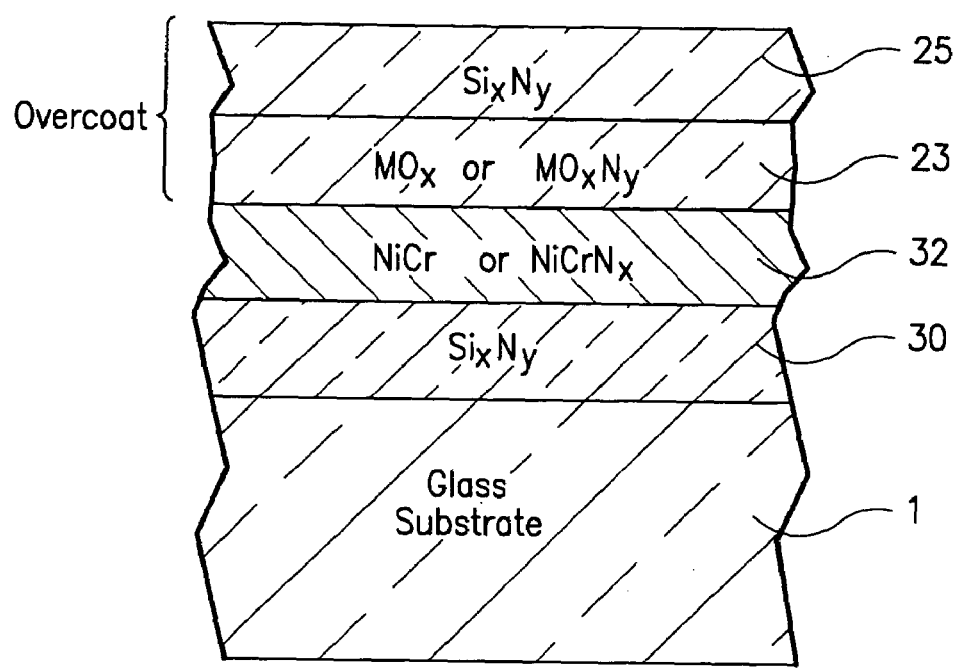
FIG. 2 is a cross sectional view of a coated article according to another example embodiment of this invention.

FIG. 2 is a cross sectional view of yet another example embodiment of this invention. In the FIG. 2 embodiment, the coated article includes a coating on glass substrate 1, where the coating includes first dielectric layer 30 of or including silicon nitride (stoichiometric or non-stoichiometric), IR reflecting layer 32 of or including Ni, NiCr, NiCrN$_x$, or the like, and an overcoat including layers 23 and 25 discussed above. Thus, it can be seen that the coatings of FIGS. 1–3 all have the same protective overcoat of layers 23 and 25. As described above, in the FIG. 2 embodiment, the overcoat includes outer layer 25 of or including silicon nitride and underlayer 23 of or including a metal oxide (MO$_x$) or a metal oxynitride (MO$_x$N$_y$), where the metal (M) is selected from the group of Cr, Nb, Hf and/or Ta, or combinations thereof.

The FIG. 2 embodiment differs optically in many respects compared to the FIGS. 1 and 3 embodiments. For example, coated articles according to the FIG. 2 embodiment may have a visible transmission of from 6–85%, more preferably from 8–80% (before and/or after heat treatment). Moreover, coated articles according to the FIG. 2 embodiment may have a sheet resistance (R$_s$) of no greater than about 350 ohms/square, more preferably no greater than about 150 ohms/square, and most preferably no greater than about 100 ohms/square. The FIG. 2 embodiment illustrates that overcoats according to certain embodiments of this invention may be used over a variety of different base coatings.

In other aspects of the FIG. 2 embodiment, the IR reflecting layer 32 may instead be of or include Nb or NbCr (or nitrides thereof), or any other suitable material.

Still referring to the FIG. 2 embodiment, while various thicknesses may be used consistent with one or more of the needs discussed herein, certain non-limiting examples of the FIG. 2 embodiment may use the example thicknesses and materials for the respective layers as follows:

TABLE 5

(Example Materials/Thicknesses; FIG. 2 Embodiment)

| Layer | Example Range (Å) | Preferred (Å) | Best (Å) |
|---|---|---|---|
| silicon nitride (layer 30): | 0–1,500 Å | 20–1,300 Å | 75–1,000 Å |
| NiCr or NiCrN$_x$ (layer 32): | 30–600 Å | 50–300 Å | 75–300 Å |
| MO$_x$ or MO$_x$N$_y$ (layer 23): | 10–500 Å | 20–150 Å | 50–100 Å |
| silicon nitride (layer 25): | 50–750 Å | 100–320 Å | 100–300 Å |

EXAMPLES

The following examples are provided for purposes of example only, and are not intended to be limiting. The following Examples (i.e., Example 1 and Comparative Example 1) were made via sputtering so as to have approximately the layer stacks set forth below, from the glass substrate outwardly.

TABLE 6

LAYER STACKS FOR EXAMPLES

| | |
|---|---|
| Ex. 1: | glass/Si$_3$N$_4$(100 Å)/NiCrN$_x$(100 Å)/Cr$_2$O$_3$(50 Å)/Si$_3$N$_4$(200 Å)/air |
| Comp. Ex. 1: | glass/Si$_3$N$_4$(100 Å)/NiCrN$_x$(100 Å)/Si$_3$N$_4$(250 Å)/air |

It can be seen that the primary difference between Example 1 according to an example embodiment of this invention, and Comparative Example 1 is that the comparative example did not include the layer 23 of the overcoat; whereas Example 1 included both layers 23 and 25 of the overcoat.

Each of Example 1 and Comparative Example 1 were then heat treated at a temperature(s) sufficient for thermal tempering, and were then subjected to a ten minute etch at room temperature using a ceric sulfate based etchant (NiCr etchant TFC available from Transene). This heat treatment and etching combination caused many visible defects to be formed in the Comparative Example. However, this same heat treatment and etching resulted in much fewer defects being formed in Example 1 thereby illustrating the significantly improved chemical/thermal durability of Example 1 compared to overcoats such as those of Comparative Example 1.

Certain terms are prevalently used in the glass coating art, particularly when defining the properties and solar management characteristics of coated glass. Such terms are used herein in accordance with their well known meaning. For example, as used herein:

The terms "heat treatment" and "heat treating" as used herein mean heating the article to a temperature sufficient to achieve thermal tempering, bending, and/or heat strengthening of the glass inclusive coated article. This definition includes, for example, heating a coated article in an oven or furnace at a temperature(s) of least about 580 or 600 degrees C. for a sufficient period to allow tempering, bending, and/or heat strengthening. In some instances, the HT may be for at least about 4 or 5 minutes, or more.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A heat treatable coated article including a multi-layer coating supported by a glass substrate, wherein the coating comprises:
    at least one infrared (IR) reflecting layer supported by at least the glass substrate;
    an overcoat located over at least the IR reflecting layer for protecting at least the IR reflecting layer, wherein the overcoat comprises an outer layer comprising silicon nitride and an underlayer comprising chromium oxide, wherein the outer layer and the underlayer of the overcoat are in direct contact with one another, with the outer layer being provided over the underlayer;
    a contact layer comprising an oxide of at least Ni provided between the IR reflecting layer and the overcoat, said IR reflecting layer being sandwiched between and contacting each of said contact layer comprising the oxide of at least Ni and a layer comprising zinc oxide; and
    wherein the coating comprises first and second IR reflecting layers each comprising Ag, wherein the first and second IR reflecting layers are both located under the overcoat.

2. The coated article of claim 1, wherein the coated article is heat treated.

3. The coated article of claim 1, wherein in the overcoat the outer layer is at least two times as thick as the underlayer.

4. The coated article of claim 1, wherein in the overcoat the outer layer is at least three times as thick as the underlayer.

5. The coated article of claim 1, wherein the coated article has a visible transmission of at least 70%, and wherein the outer layer of the overcoat comprising silicon nitride further includes aluminum.

6. The coated article of claim 1, wherein the overcoat consists of the outer layer and the underlayer.

7. A heat treatable coated article including a multi-layer coating supported by a glass substrate, wherein the coating comprises:
    at least one infrared (IR) reflecting layer supported by at least the glass substrate;
    an overcoat located over at least the IR reflecting layer for protecting at least the IR reflecting layer, wherein the overcoat comprises an outer layer comprising silicon nitride and an underlayer comprising chromium oxide, wherein the outer layer and the underlayer of the overcoat are in direct contact with one another, with the outer layer being provided over the underlayer; and
    a contact layer comprising an oxide of nickel and/or an oxide of chrome located directly between and contacting the IR reflecting layer and the underlayer comprising chromium oxides, and wherein said IR reflecting layer is sandwiched between and contacts each of said contact layer comprising the oxide of nickel and/or the oxide of chrome and a layer comprising zinc oxide.

8. The coated article of claim 7, wherein the coating comprises first and second IR reflecting layers each comprising Ag, wherein the first and second IR reflecting layers are both located under the overcoat.

9. A heat treatable coated article including a multi-layer coating supported by a glass substrate, wherein the coating comprises:
    at least one infrared (IR) reflecting layer supported by at least the glass substrate;

an overcoat located over at least the IR reflecting layer for protecting at least the IR reflecting layer, wherein the overcoat comprises an outer layer comprising silicon nitride and an underlayer comprising chromium oxide, wherein the outer layer and the underlayer of the overcoat are in direct contact with one another, with the outer layer being provided over the underlayer; and wherein the IR reflecting layer is sandwiched between and contacting each of a layer comprising an oxide of nickel and/or an oxide of chrome and a layer comprising zinc oxide.

10. The coated article of claim 9, wherein the IR reflecting layer comprises silver.

11. The coated article of claim 9, wherein in the overcoat the outer layer is at least two times as thick as the underlayer.

12. The coated article of claim 9, wherein the coated article has a visible transmission of at least 70%, and wherein the outer layer of the overcoat comprising silicon nitride further includes aluminum.

13. The coated article of claim 9, wherein the overcoat consists of the outer layer and the underlayer.

14. A coated article including a multi-layer coating supported by a glass substrate, wherein the coating comprises:
at least one infrared (IR) reflecting layer comprising silver;
an overcoat located over at least the IR reflecting layer for protecting at least the IR reflecting layer, wherein the overcoat comprises an outer layer comprising silicon nitride and an underlayer comprising a metal (M) oxide and/or a metal (M) oxynitride, where the metal (M) is at least one of Nb, Hf, Ta, or a combination thereof, and wherein the underlayer does not contact any IR reflecting layer comprising silver in the coating; and
wherein the IR reflecting layer comprising silver is sandwiched between and contacts each of a layer comprising an oxide of nickel and/or an oxide of chrome and a layer comprising zinc oxide.

15. The coated article of claim 14, wherein the coated article is heat treated.

16. The coated article of claim 14, wherein in the overcoat the outer layer is at least two times as thick as the underlayer.

17. The coated article of claim 14, wherein in the overcoat the outer layer is at least three times as thick as the underlayer.

18. The coated article of claim 14, wherein the coated article has a visible transmission of at least 70%, and wherein the outer layer of the overcoat comprising silicon nitride further includes aluminum.

19. The coated article of claim 14, wherein the overcoat consists of the outer layer and the underlayer.

20. The coated article of claim 14, wherein the coating comprises first and second IR reflecting layers each comprising Ag, wherein the first and second IR reflecting layers are both located under the overcoat.

21. The coated article of claim 14, wherein the metal (M) comprises Hf.

22. A heat treatable coated article including a multi-layer coating supported by a glass substrate, wherein the coating comprises:
at least one infrared (IR) reflecting layer;
an overcoat located over at least the IR reflecting layer for protecting at least the IR reflecting layer, wherein the overcoat comprises an outer layer comprising silicon nitride and an underlayer comprising a metal (M) oxide and/or a metal (M) oxynitride, where the metal (M) is at least one of Nb, Hf, Ta, or a combination thereof; and
wherein the IR reflecting layer is sandwiched between and contacting each of (a) a layer comprising an oxide of nickel and/or an oxide of chrome, and (b) a layer comprising zinc oxide.

23. The coated article of claim 22, wherein the metal (M) comprises Nb, and wherein the outer layer comprising silicon nitride is the outermost layer of the coating.

24. The coated article of claim 22, wherein the underlayer is selected from the group consisting of $Cr_2O_3$, $Nb_2O_5$, $Hf_2O_3$, $Ta_2O_5$, and/or a combination of one or more of these materials, and wherein the underlayer is at least partially nitrided so a to form an oxynitride.

25. The coated article of claim 22, wherein the IR reflecting layer comprises silver.

26. The coated article of claim 22, wherein in the overcoat the outer layer is at least two times as thick as the underlayer.

27. The coated article of claim 22, wherein the coated article has a visible transmission of at least 70 %, and wherein the outer layer of the overcoat comprising silicon nitride further includes aluminum.

28. The coated article of claim 22, wherein the overcoat consists of the outer layer and the underlayer.

29. The coated article of claim 22, wherein the IR reflecting layer comprises at least one of Nb and NiCr.

30. A heat treatable coated article including a multi-layer coating supported by a glass substrate, wherein the coating comprises:
at least one infrared (IR) reflecting layer;
an overcoat located over at least the IR reflecting layer for protecting at least the IR reflecting layer, wherein the overcoat comprises an outer layer comprising silicon nitride and an underlayer comprising a metal (M) oxide and/or a metal (M) oxynitride, where the metal (M) is at least one of Nb, Hf, Ta, or a combination thereof; and
wherein the IR reflecting layer comprises material selected from the group consisting of NiCr, Nb, and NbCr, and
wherein the IR reflecting layer is located between the underlayer of the overcoat and another layer comprising silicon nitride.

* * * * *